(12) United States Patent
Maeda

(10) Patent No.: US 6,212,113 B1
(45) Date of Patent: Apr. 3, 2001

(54) SEMICONDUCTOR MEMORY DEVICE INPUT CIRCUIT

(75) Inventor: Kazunori Maeda, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/499,552

(22) Filed: Feb. 7, 2000

(30) Foreign Application Priority Data

Feb. 9, 1999 (JP) .................................................. 11-031108

(51) Int. Cl.[7] ...................................................... G11C 7/00
(52) U.S. Cl. .................... 365/201; 365/233; 365/189.05; 327/145
(58) Field of Search ............................... 365/189.05, 201, 365/233; 327/144, 145; 714/718

(56) References Cited

U.S. PATENT DOCUMENTS 5,900,753 * 5/1999 Côté et al. ............................ 327/145
5,991,232 * 11/1999 Matsumura et al. ................. 365/233

* cited by examiner

*Primary Examiner*—Son Mai
(74) *Attorney, Agent, or Firm*—Darryl G. Walker

(57) ABSTRACT

A double-data rate (DDR) memory device is disclosed that can be configured for testing on an ordinary memory tester. The DDR memory may include a DDR input circuit (102), a single data rate input circuit (104), a word line control circuit (106), a bit line control circuit (108), and a memory cell array (110). Normal write operations may be performed by selecting the DDR input circuit (102). Test write operations may be performed by selecting the SDR input circuit (104). Such an arrangement can enable a DDR memory device to be tested in an ordinary SDR memory tester.

20 Claims, 5 Drawing Sheets

SEMICONDUCTOR MEMORY DEVICE INPUT CIRCUIT

TECHNICAL FIELD

The present invention relates generally to semiconductor devices, and more particularly to input circuits for double data rate (DDR) synchronous dynamic random access memories (SDRAM).

BACKGROUND OF THE INVENTION

The operating speeds and computing power of electronic systems continues to increase. As a result, the demand for semiconductor devices having higher speed and/or greater transfer rates has grown correspondingly. To meet such demands, many systems use synchronous dynamic random access memories (DRAMs) as opposed to asynchronous DRAMs. Synchronous DRAMs can provide faster access speeds and/or transfer rates than asynchronous DRAMs.

In pursuit of even higher access speeds and/or transfer rates, some semiconductor memories utilize "double-data rate" (DDR), as opposed to single data rate (SDR), approaches. A SDR semiconductor memory can perform data write operations in synchronism with a clock signal. That is, the fastest rate at which data can be written is one write per clock cycle. A DDR semiconductor memory can perform data write operations at twice the rate of an SDR device. That is, two writes can be performed to a DDR device per clock cycle. Some DDR devices can accomplish such faster write operations by writing data in synchronism with a first clock signal and a second clock signal, where the second clock signal is the inverse of the first.

Referring now to FIG. 5, a block diagram is shown illustrating a general purpose DDR-only data input circuit. The DDR-only data input circuit includes a first stage circuit 500 and five D-type flip-flop (FF) circuits 502 to 510. Write operations in the DDR-only data input circuit can be performed according three clock signals CLK, CLKB and DQS.

The input circuit of FIG. 5 can receive data at an input terminal DQ. Data received at the input terminal may be latched in various D-type flip-flops 502 to 510 according to the CLK, CLKB and DQS clock signals. Two data write operations can be performed in synchronism with each clock cycle.

DDR-type semiconductor devices normally operate in a DDR mode. Thus, the testing of a DDR-type semiconductor device can require three clock signals CLK, CLKB and DQS. In addition, a DDR-type semiconductor device can have stringent timing requirements, such as input signal set-up and hold times. It may not be possible for an ordinary memory tester to generate such multiple clock signals and/or meet more stringent timing requirements. Ordinary memory testers are typically designed to test SDR type memory devices.

Semiconductor devices may have input circuits that can be used in a DDR mode and an SDR mode. However such input circuits are typically very complex. Further, such circuits may result in the operation of circuits for one mode interfering with the operation of circuits in another mode.

In light of the prevalence of ordinary memory testers that are capable of testing in a SDR mode but are not sufficient for testing DDR modes, it would be desirable to arrive at some way of providing a semiconductor device having a DDR mode that may be tested with an ordinary (SDR mode) memory tester. Further, it would be desirable to provide such a semiconductor device without an overly complex circuit configuration.

SUMMARY OF THE INVENTION

According to one embodiment of the present invention, a semiconductor device can include a normal mode input circuit and a test mode input circuit. The normal mode input circuit can be connected to an input terminal and include first and second latch circuits that operate in an alternate fashion in response to first, second and third clock signals. Data received in a sequential fashion at the input terminal can be output through the first or second latch circuit. A test mode input circuit can also be connected to the input terminal and include a third latch circuit that operates in response to the first clock signal. Data can be written through the normal mode input circuit in a normal mode and through a test mode circuit in a test mode.

According to one aspect of the embodiments, because data can be written through the normal mode input circuit in a normal mode and through a test mode circuit in a test mode, the semiconductor device may be easily configurable between the normal and test modes.

According to another aspect of the embodiments, by providing a test mode input circuit the semiconductor device can provide write operations in a normal mode at data rates faster than those achievable by ordinary memory testers, yet allow the semiconductor device to be tested on an ordinary tester.

According to another aspect of the embodiments, a semiconductor device can include a normal mode input circuit that can operate in response to first, second and third clock signals, and a test mode circuit that can operate in response to the first clock signal. The second clock signal may be complementary to the first clock signal. The third clock signal may have the same essential period as the first clock signal, but can be delayed with respect to the first clock signal.

According to another aspect of the embodiment, a third clock signal may be an externally applied clock signal. The normal mode can be a double-data rate (DDR) mode in which two data values can be written in one clock signal cycle.

DETAILED DESCRIPTION OF THE EMBODIMENTS

A semiconductor device according to one embodiment will now be described with reference to a number of figures. The particular example described includes edge triggered D-type flip-flops (FFs). Edge triggered D-type FFs can latch an input value "D" on the leading edge of a clock input signal.

Figure 1:
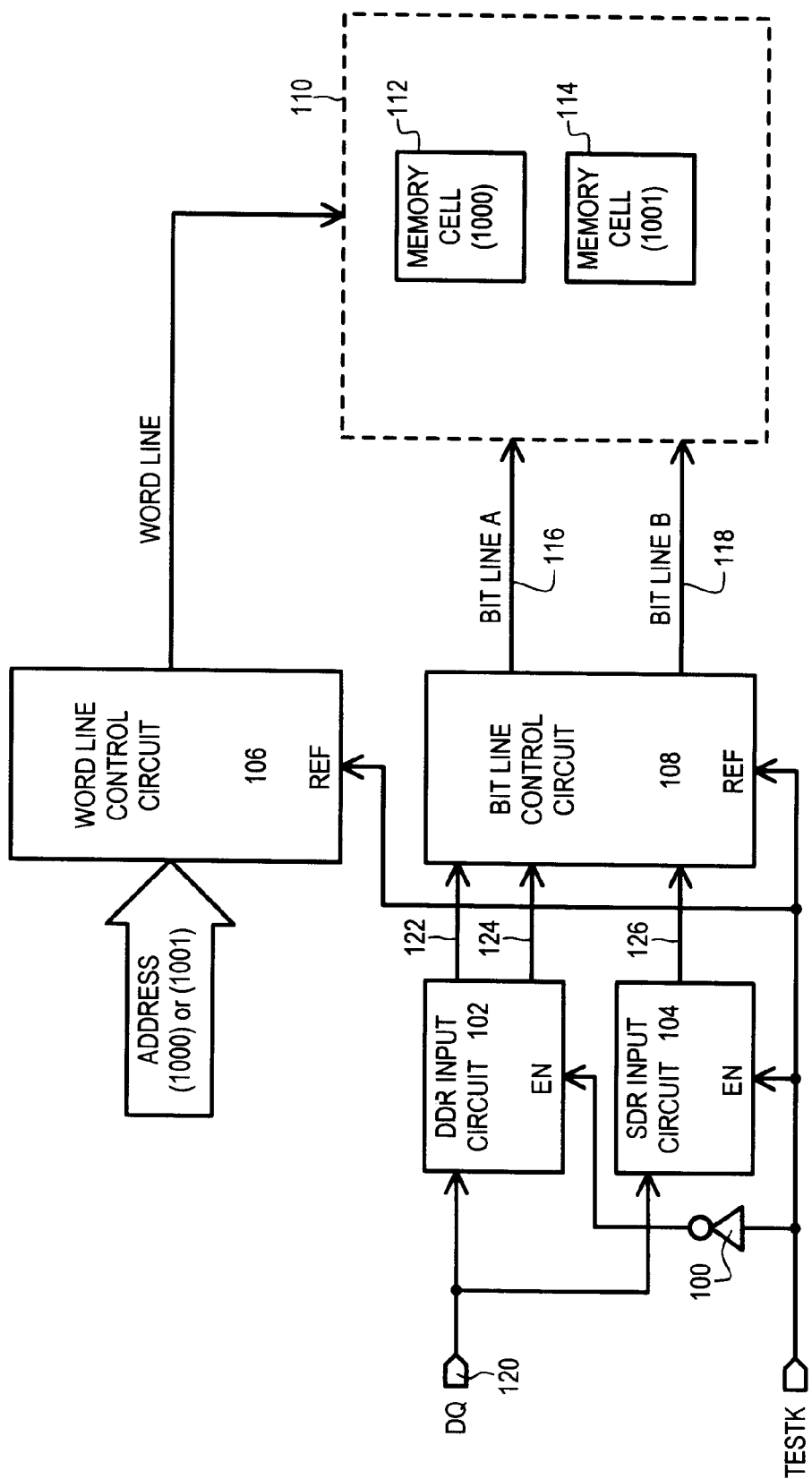
FIG. 1 is a block diagram of a semiconductor device according one embodiment of the present invention.

FIG. 1 shows a block diagram of a semiconductor memory device according to one embodiment. In the following description, the application of two four-bit addresses (1000 1001) will be described.

The semiconductor memory device of FIG. 1 can include an inverter 100 a double-data rate (DDR) input circuit 102, a single-data rate (SDR) input circuit 104, a word line control circuit 106, a bit line control circuit 108, and a memory cell array 110. The DDR input circuit 102 and SDR input circuit 104 each include enable inputs EN. In the particular arrangement of FIG. 1, when an enable input EN receives a high signal, the input circuit (102 or 104) is enabled. Conversely, when an enable input EN receives a low signal, the input circuit (102 or 104) is disabled. A DDR input circuit 102 and/or SDR input circuit 104 can operate according to input signals when enabled. Such operation ceases when the input circuit (102 or 104) is disabled. This can suppress the amount of current consumed by a disabled input circuit (102 and 104). A disabled input circuit (102 and 104) may also provide a high impedance output.

It is understood that while a memory cell array 110 may include a number of memory cells and bit lines, FIG. 1 shows only two of the memory cells (112 and 114). Memory cell 112 may have the address 1000, and memory cell 114 may have the address 1001. A bit line A 116 can be connected to memory cell 112, and a bit line B 118 can be connected to memory cell 114. Such an arrangement can represent how one half of a group of memory cells can be connected to one bit line (bit line A 116) while another half can be connected to another bit line (bit line B 118).

A word line control circuit 106 can select memory cells according to a received word line address. A bit line control circuit 108 can control write operation to memory cells (such as 112 and 114). A test activation signal TESTK can be connected to the enable input EN of SDR input circuit 104 and to the enable input EN of DDR input circuit 102 by way of inverter 100. The test activation signal TESTK may also be applied to reference inputs of the word line control circuit 106 and the bit line control circuit 108. An input terminal DQ 120 may be connected to inputs of the DDR input circuit 102 and SDR input circuit 104.

Having described the general arrangement of one embodiment, the operation of the embodiment will now be described. In particular, a write operation for a DDR and SDR mode will be described.

Figure 3:
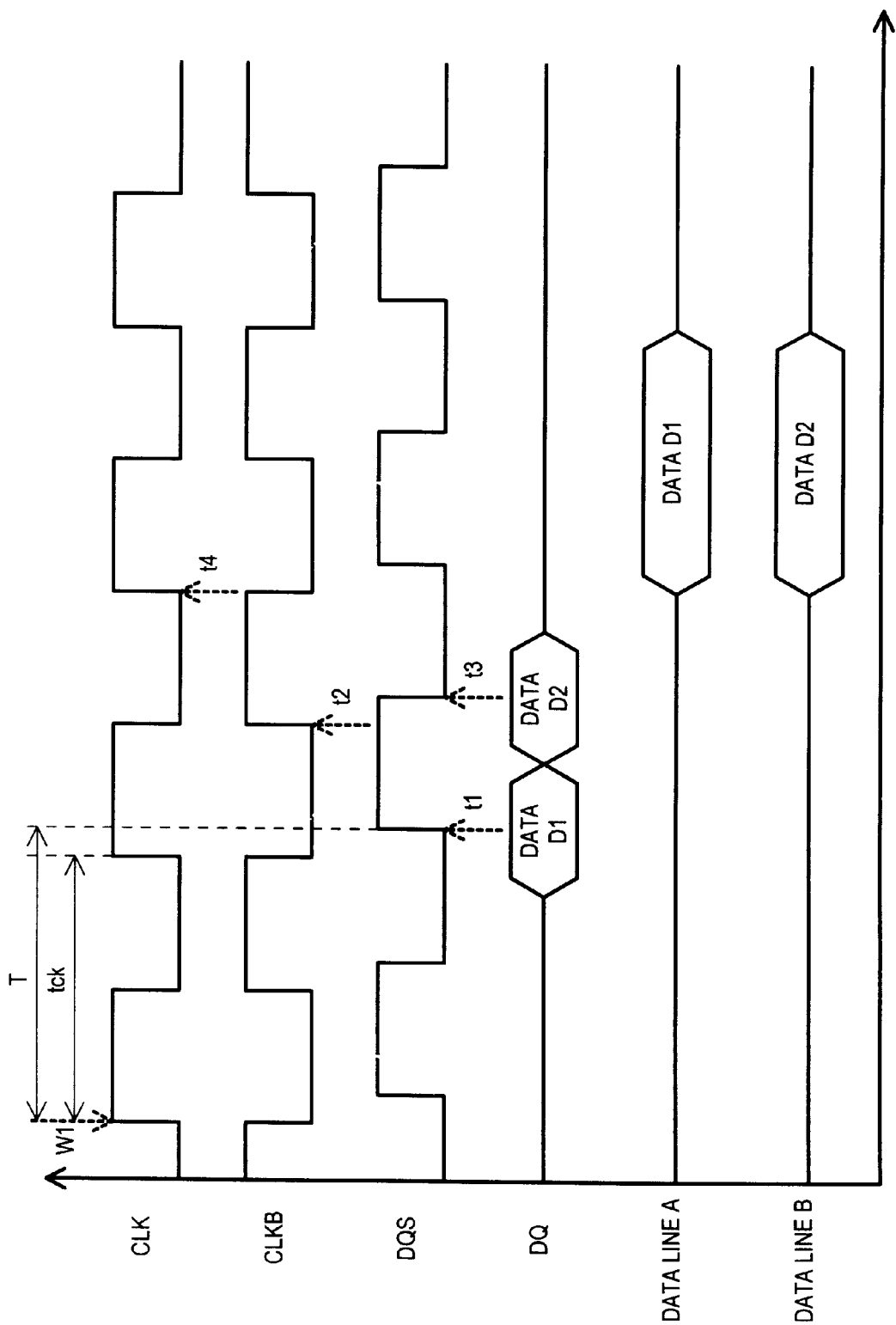
FIG. 3 is a timing diagram illustrating a DDR mode write operation.

First, a "normal" DDR operation will be described. In a DDR operation, the TESTK signal is low, indicating a non-test mode. An address 1000 may then be applied. Referring now to FIGS. 1 and 3, the word line control circuit 106 can mask the lowest bit of the address and therefore selects memory cell 112 (which corresponds to address 1000) and memory cell 114 (which corresponds to address 1001).

The bit line control circuit 108 can identify the lowest bit of an address, and can connect data lines A and B (122 and 124) to bit lines A and B (116 and 118) according to the masked lower address bit. For example, if the value of the lowest bit is 0, data line A 122 will be connected with bit line A 116 and data line B 124 will be connected to bit line B 118. If the value of the lowest bit is 1, data line A 122 will be connected to bit line B 118 and data line B 124 will be connected to bit line A 116.

In this way, data values D1 and D2 may be written into memory cells 112 and 114 (or 114 and 112). Further, such writing is performed at a "double" rate as the data values D1 and D2 are written in one clock cycle (tck).

Figure 4:
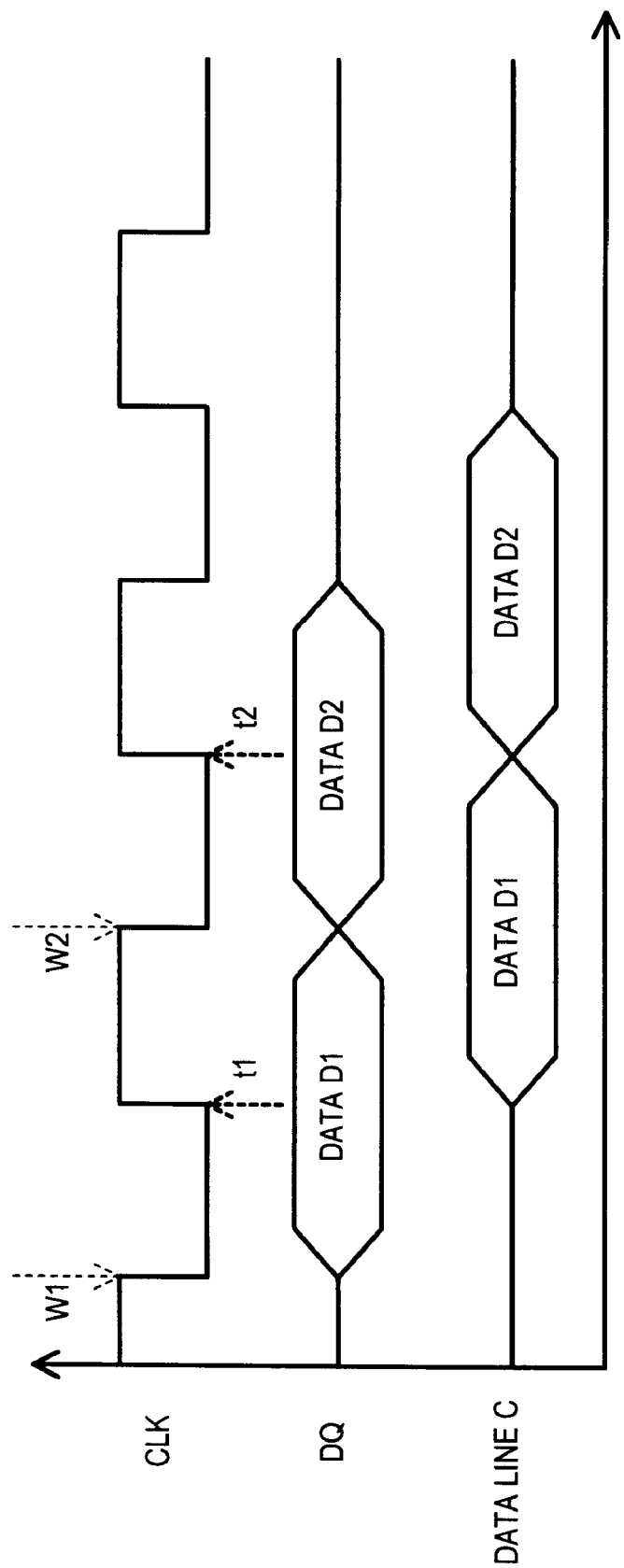
FIG. 4 is a timing diagram illustrating a SDR mode write operation.
Figure 5:
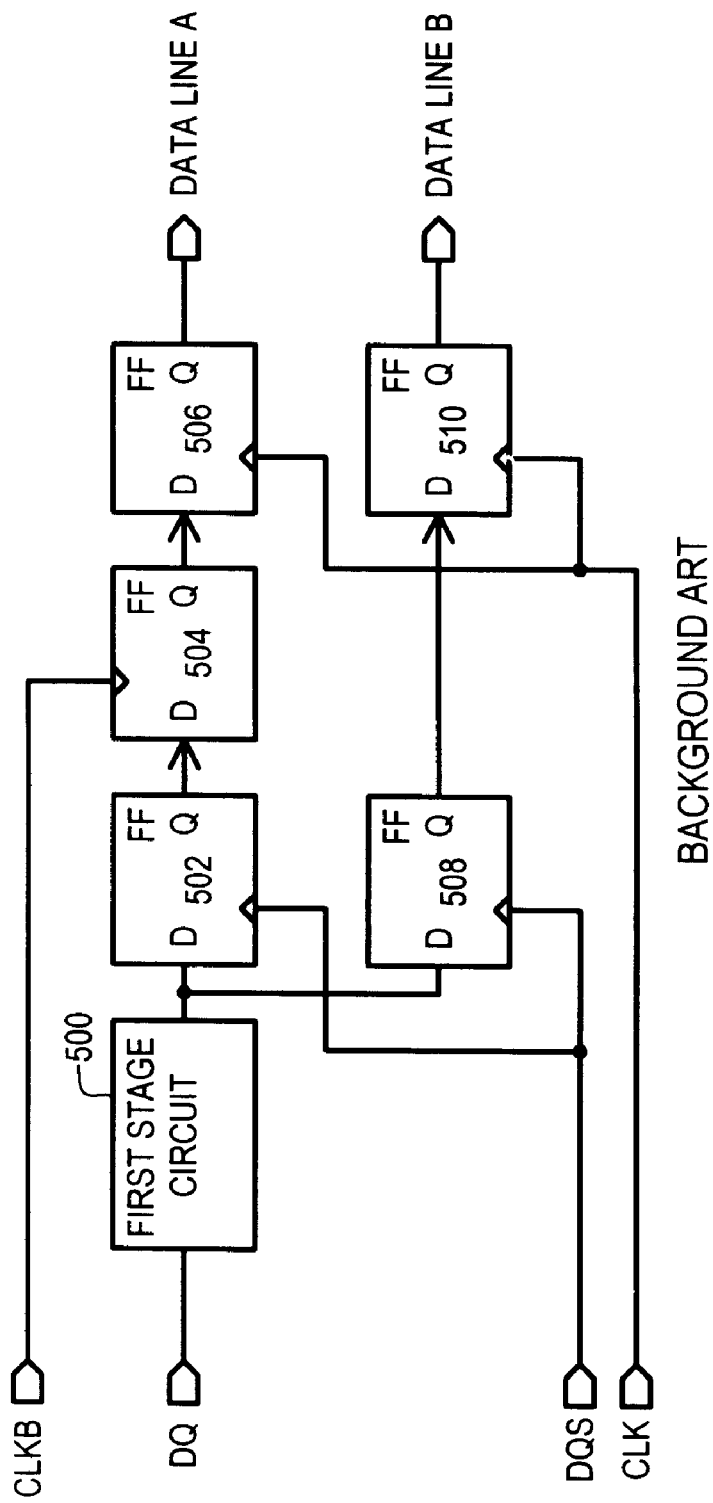
FIG. 5 is a circuit diagram of a conventional DDR input circuit.

Second, a "test" SDR operation will be described. In a SDR operation, the TESTK signal is high, indicating a test mode. In this example, addresses 1000 and 1001 are input at different times. Referring now to FIGS. 1 and 4, address 1000 can be entered at a first write enable time W1 while address 1001 can be entered at a second write enable time W2. In response to address 1000, word line control circuit 106 can select memory cell 112. In response to address 1001, word line control circuit 106 can select memory cell 114.

The bit line control circuit 108 can identify the lowest bit of and address, and can connect data line C 126 to bit line A 116 or B 118 according to a lower address bit. For example, if the value of the lowest bit is 0, data line C 126 can be connected with bit line A 116. If the value of the lowest bit is 1, data line C 126 can be connected to bit line B 118.

In this way, data values D1 and D2 may be written into memory cells 112 and 114. Further, such writing is performed at a "single" rate as the data values D1 and D2 are written in two clock cycles (tck).

Figure 2:
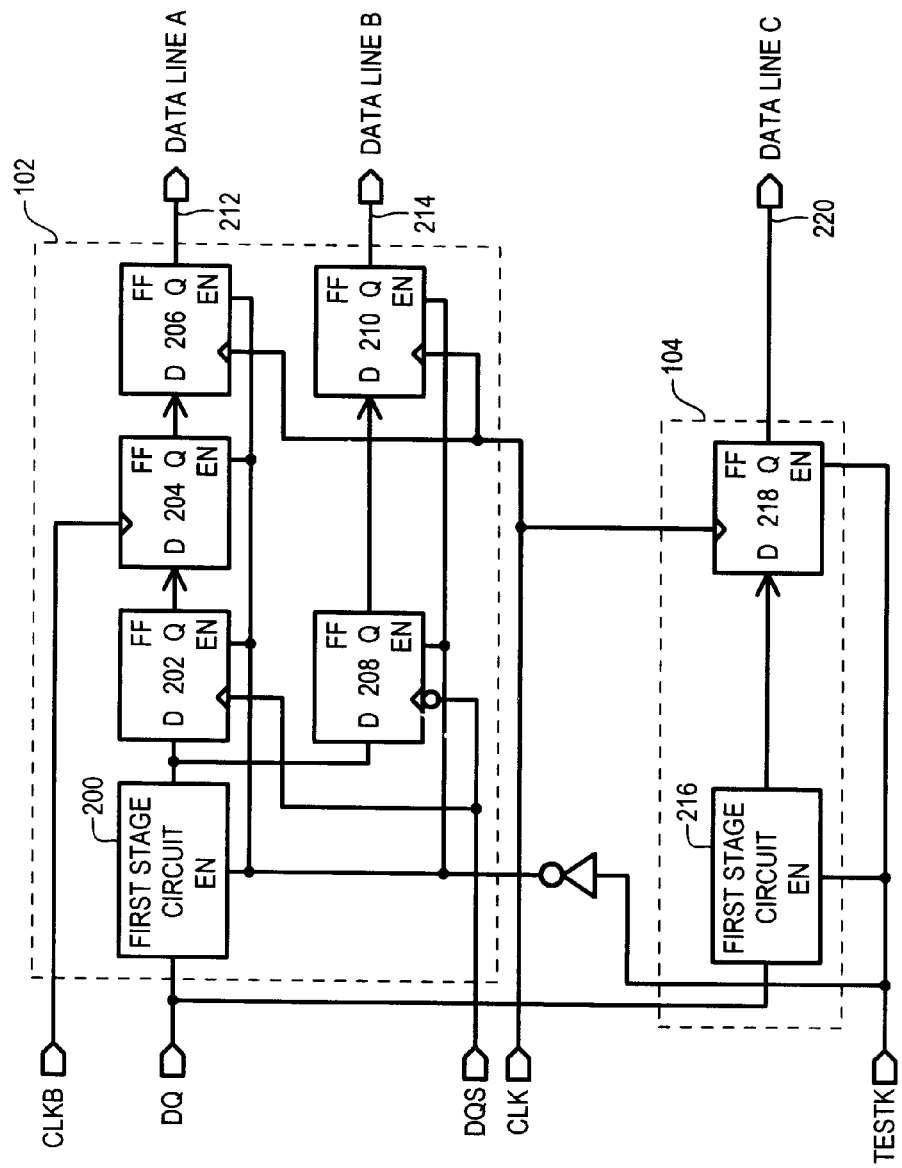
FIG. 2 is a circuit diagram showing a double-data rate (DDR) input circuit and a single data rate (SDR) input of a semiconductor device such as that shown in FIG. 1.

Referring now to FIG. 2, one example of a DDR input circuit and SDR input circuit will be described in detail. In FIG. 2, a DDR input circuit is shown as item 102 and a SDR input circuit is shown as item 104.

The DDR input circuit 102 can include a first stage circuit 200 and D-type FFs 202 to 210. Data received by DDR input circuit 102 can be written according to three clock signals CLK, CLKB and DQS. The CLK and CLKB signals can be complementary to one another. The DQS signal can be a clock signal that is received from a source external to the synchronous DRAM, and that is synchronous with applied write data.

The DDR input circuit 102 can include a first stage circuit 200. A first stage circuit 200 may convert the level of a received data signal. As one example, the first stage circuit 200 may convert a data signal to complementary metal-oxide-semiconductor (CMOS) levels. An output of first stage circuit 200 can be connected to the D input of D-type FFs 202 and 208. D-type FFs 202, 204 and 206 can form one group of FFs, while D-type FFs 208 and 210 can form another group. Each group of FFs can be connected in a cascade fashion, with the D input of one FF receiving the Q output of a previous FF in the group.

The D-type FF 204 may be conceptualized as a latch circuit that ensures a hold time for D-type FF 202 and a setup time for D-type FF 206.

The last D-type FF 206 of group 202/204/206 can have a Q output connected to a data line A 212. The last D-type FF 210 of group 208/210 can have a Q output connected to a data line B 214.

In the particular arrangement of FIG. 2, the clock signal DQS can be connected to a clock input of D-type FF 202 and to an inverted clock input of D-type FF 208. The clock signal CLKB can be connected to a clock input of D-type FF 204. The clock signal CLK can be connected to clock inputs of D-type FFs 206 and 210.

The test signal TESTK can be coupled to enable inputs EN of the first stage circuit 200 and the D-type FFs 202, 204, 206, 208 and 210 by way of an inverter 100.

The SDR input circuit can include a first stage circuit 216 and a D-type FF 218. First stage circuit 216, like first stage circuit 200, can convert the level of a received data signal to CMOS levels, as but one example. D-type FF 218 can have a clock input that receives clock signal CLK. The first stage circuit 216 and D-type FF 218 have enable inputs connected to the test signal TESTK.

A normal write operation for the arrangement of FIG. 2 will now be described. In a normal write operation, the TESTK signal is at a low level. When the TESTK signal has a low level, the circuits of the SDR input circuit 104 can be disabled while the circuits of the DDR input circuit 102 can be enabled.

Referring again to FIG. 3, the timing chart shows a write operation in the DDR mode. In the DDR mode, write operations can be performed according to three clock signals CLK, CLKB and DQS. As noted above, the CLKB signal can be the inverse of clock signal CLK.

The clock signal DQS can be received from an external source, and in synchronism with write data. The various clock signals CLK, CLKB and DQS can have the same frequency.

As shown in FIG. 3, following a write enable time W1, a data value D1 may be latched after a time T. In one particular arrangement, the time period T may satisfy the relationship tck×0.75≦T≦tck×1.25, where tck is the period of clock signal CLK (and CLKB). The data values D1 and D2 can be input from terminal DQ within an interval of one clock cycle (tck).

At time t1, on the leading edge of clock signal DQS data value D1 can be latched in D-type FF 202.

At time t2, on the leading edge of the clock signal CLKB, the data value previously latched in D-type FF 202 can be latched in D-type FF 204.

At time t4, on the leading edge of clock signal CLK, the data value previously latched in D-type FF 204 can be latched in D-type FF 206, and output on data line A 212.

In this way a first data value may be latched and propagate through the D-type FFs 202, 204 and 206 to data line A 212.

However, in the double-data rate operation, a second data value can be provided in data line B 214. In the particular operation illustrate by FIG. 3, at time t3, on the falling edge of clock signal DQS, a second data value D2 can be latched in D-type FF 208.

At time t4, the data value D2 latched in D-type FF 208 can be latched in D-type FF 210, and output on data line B 214.

In this way a second data value may be latched and propagate through D-type FFs 208 and 210.

As shown by FIG. 3, in a DDR mode, a data value D1 may be output on data line A 212 within one clock cycle from the time the data value is latched. Simultaneously, a second data value D2 may be output on data line B 214 in the same time period. In this way, two data values may be written simultaneously within one clock cycle in the DDR mode.

A test write operation for the arrangement of FIG. 2 will now be described. In a test write operation, the TESTK signal is at a high level. When the TESTK signal has a high level, the circuits of the DDR input circuit 102 can be disabled while the SDR input circuit 104 can be enabled.

Referring again to FIG. 4, the timing chart shows a write operation in the SDR mode. In the SDR mode, write operations can be performed according to the clock signal CLK. This is in contrast to above-described DDR mode which may require three clock signals.

In the SDR write operation of FIG. 4, two data values are written, D1 and D2. Unlike the operation shown in FIG. 3, in FIG. 4 a first data value D1 can be input one clock cycle (tck) following a first write enable time W1. A second data value D2 can be input one clock cycle (tck) following a second write enable time W2. Such data values may be input at terminal DQ.

At time t1, a data value D1 can be latched in D-type FF 218 and output on data line C 220. At time t2, a data value D2 can be latched in D-type FF 218 and output on data line C 220. In this way, in the SDR mode shown, two values (D1 and D2) can be output at two 20 different times on data line C 220.

As has been shown, a semiconductor device according to the present invention can perform a write operation in a DDR mode by placing a test signal TESTK at a first level (low, for example). The semiconductor can also perform a write operation in a SDR mode by placing the test signal TESTK at a second level (high, for example).

The embodiments have also illustrated a semiconductor device having an input circuit arrangement in which one circuit that can be dedicated to a DDR mode of operation while another can be dedicated to a SDR mode of operation. Selection between the circuits can be accomplished with a test signal. This can provide for easy configuration between the two modes. This is in contrast to single input circuits that may be used for both DDR and SDR operations. Such multi-use may be more complex and more difficult to employ.

Thus, a semiconductor device has been disclosed having input circuits that may easily be configured for either DDR or SDR modes. Such an arrangement can allow a DDR-type semiconductor device to be tested by an ordinary memory tester in the SDR mode. This can save test time and obviate the need to build and/or purchase more expensive memory testers.

It is understood that while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor memory device, comprising:
   a first terminal that can receive sequential data values;
   a first mode input circuit connected to the first terminal that includes at least one first latch circuit and at least one second latch circuit that alternately latch the sequential data values, the alternately latched data values propagating through the at least one first latch circuit and the at least one second latch circuit in response to a first, second and third clock signal;
   a test mode input circuit connected to the first terminal that includes at least one third latch circuit that latches data according to the first clock signal; wherein
   data can be written to memory cells through the first mode input circuit in a first mode and through the test mode input circuit in a test mode.

2. The semiconductor memory device of claim 1, wherein:
   the second clock signal is the complement of the first clock signal, and
   the third clock signal has the same general frequency as the first clock signal and has a predetermined delay with respect to the first clock signal.

3. The semiconductor memory device of claim 2, wherein:
   the predetermined delay is in the range of about 75% to 125% of a first clock signal cycle.

4. A semiconductor device, comprising:
   a data input terminal;
   a test input circuit coupled to the data input terminal that latches a first number of sequential data values within one cycle of a first clock signal in a test mode; and a first input circuit coupled the data input terminal that latches a second number of sequential data values within one cycle of the first clock signal in a first mode, the second number being greater than the first number.

5. The semiconductor device of claim 4, wherein:

the test input circuit can latch sequential data values in response to the first clock signal; and the first input circuit includes
a first data path that transfers one data value in response to at least the first clock signal, and
a second data path that transfers another data value in response to at least a second clock signal.

6. The semiconductor device of claim 5, wherein:

the first data path transfers one data value in response to the first clock signal and the second clock signal, the second clock signal being the inverse of the first clock signal.

7. The semiconductor device of claim 5, wherein:

the first data path includes a plurality of first group D-type flip-flop (FF) circuits arranged in series, and the second data path includes a plurality of second group D-type FFs arranged in series.

8. The semiconductor device of claim 7, wherein:

the first group D-type FFs includes a first group input D-type FF that latches data in response to a third clock signal, and the second group D-type FFs includes a second group input D-type FF that latches data in response to the third clock signal.

9. The semiconductor device of claim 7, wherein:

the first group D-type FFs includes a first group output D-type FF that outputs latched data in response to the first clock signal, and the second group D-type FFs includes a second group output D-type FF that outputs latched data in response to the first clock signal.

10. The semiconductor device of claim 4, wherein:

the data input terminal is coupled to the first data path and the second data path by a first stage circuit, the first stage circuit driving data input values to predetermined levels.

11. The semiconductor device of claim 10, wherein:

the predetermined levels are complementary metal-oxide-semiconductor (CMOS) levels.

12. The semiconductor device of claim 4, wherein:

the test input circuit latches sequential data values at the data input terminal in response to the first clock signal; and the first input circuit latches sequential data values at the data input terminal in response to a third clock signal.

13. The semiconductor device of claim 4, wherein:

the test input circuit includes a D-type flip-flop (FF) circuit that latches sequential data in response to the first clock signal.

14. A semiconductor device, comprising:

a test input circuit that latches data from a data input terminal at a first rate in response to a first clock signal in a test mode; and a first input circuit that latches data from the data input terminal at a second rate that is faster than the first rate in response to a third clock signal, the first input circuit being disabled in the test mode.

15. The semiconductor device of claim 14, wherein:

the test input circuit is enabled when a test signal has a first value and disabled when the test signal has a second value; and the first input circuit is disabled when the test signal has the first value and enabled when the test signal has the second value.

16. The semiconductor device of claim 14, wherein:

the test input circuit includes a test latching circuit having an input coupled to the data input terminal and a control input coupled to a first clock signal.

17. The semiconductor device of claim 16, wherein:

the test input circuit includes a test first stage circuit that couples the data input terminal to the test latching circuit, the test first stage circuit translating input signal values to predetermined levels.

18. The semiconductor device of claim 14, wherein:

the first input circuit includes
a first data path with a first path latching circuit having a control input coupled to the first clock signal, and
a second data path with a second path latching circuit having a control input coupled to the first clock signal.

19. The semiconductor device of claim 18, wherein:

the first data path includes a first path input latching circuit having a control input coupled to a third clock signal, and the second data path includes a second path input latching circuit having a control input coupled to the third clock signal.

20. The semiconductor device of claim 19, wherein:

the first data path includes a transfer latching circuit having a control input coupled to a second clock signal.

* * * * *